(12) United States Patent
Wang et al.

(10) Patent No.: US 11,337,318 B1
(45) Date of Patent: May 17, 2022

(54) ADJUSTABLE VENTING RATIO MECHANISM FOR INFORMATION HANDLING SYSTEM

(71) Applicant: Dell Products L.P., Round Rock, TX (US)

(72) Inventors: Yen-Lin Wang, Taipei (TW); Chao-Hung Li, Linkou Dist. (TW); Jen-Chun Hsueh, Kaohsiung (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/088,250

(22) Filed: Nov. 3, 2020

(51) Int. Cl.
*H05K 5/02* (2006.01)
*G06F 1/20* (2006.01)

(52) U.S. Cl.
CPC ............. *H05K 5/0213* (2013.01); *G06F 1/20* (2013.01)

(58) Field of Classification Search
CPC ...... H05K 5/0213; H05K 5/0239; H05K 7/20; G06F 1/20; H02B 1/565; B60H 1/3421
See application file for complete search history.

(56) References Cited

U.S. PATENT DOCUMENTS

| | | | | | |
|---|---|---|---|---|---|
| 6,050,892 | A * | 4/2000 | Sodec | ............. | F24F 13/06 454/289 |
| 6,106,687 | A * | 8/2000 | Edelstein | ............. | C25D 17/001 205/98 |
| 6,361,432 | B1 * | 3/2002 | Walker | ............. | F24F 13/06 454/290 |
| 6,607,434 | B1 * | 8/2003 | Park | ............. | B60H 1/3421 454/155 |
| 7,508,663 | B2 * | 3/2009 | Coglitore | ............. | H05K 7/20736 165/122 |
| 2012/0322357 | A1 * | 12/2012 | Zhang | ............. | G06F 1/181 454/339 |
| 2013/0128450 | A1 * | 5/2013 | Redshaw | ............. | H05K 7/20145 361/679.46 |
| 2020/0156446 | A1 * | 5/2020 | Youn | ............. | B60H 1/345 |

FOREIGN PATENT DOCUMENTS

CN    107515646 A   * 12/2017

OTHER PUBLICATIONS

Chen, Wei-Wang, "A new case of good dustproof effect", Dec. 26, 2017, Zhongshan Chengbo Industry Product Design Co., Ltd., Entire Document (translation of CN-107515646-A) (Year: 2017).*

* cited by examiner

*Primary Examiner* — Stephen S Sul
*Assistant Examiner* — Alexander Ryan Horton
(74) *Attorney, Agent, or Firm* — Jackson Walker L.L.P.

(57) ABSTRACT

An information handling system may include a chassis and a variable venting assembly comprising a wall having a plurality of spaced venting holes and an adjustable venting block mechanically coupled to the wall via an axis of rotation and having a plurality of spaced blocking fins such that as a position of the adjustable venting block varies, an overlap between the spaced blocking fins and the spaced venting holes varies.

18 Claims, 7 Drawing Sheets

ADJUSTABLE VENTING RATIO MECHANISM FOR INFORMATION HANDLING SYSTEM

TECHNICAL FIELD

The present disclosure relates in general to information handling systems, and more particularly to a venting assembly having an adjustable venting ratio.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

In design of an information handling system chassis, a venting ratio of a front and rear wall is a key factor in total air flow rate and air flow impedance in the information handling system. Some configurations may require lower venting ratios to prevent air flow bypass while other configurations may desire higher venting ratios to enhance thermal performance.

Existing approaches often use vents with a fixed venting ratio. However, such approaches are often unable to support different configuration requirements of information handling systems. Accordingly, an information handling system chassis may come with various replaceable parts with varying venting ratio designs to fulfill different configuration requirements.

SUMMARY

In accordance with the teachings of the present disclosure, the disadvantages and problems associated with traditional approaches to venting in an information handling system may be substantially reduced or eliminated.

In accordance with embodiments of the present disclosure, an information handling system may include a chassis and a variable venting assembly comprising a wall having a plurality of spaced venting holes and an adjustable venting block mechanically coupled to the wall via an axis of rotation and having a plurality of spaced blocking fins such that as a position of the adjustable venting block varies, an overlap between the spaced blocking fins and the spaced venting holes varies.

In accordance with these and other embodiments of the present disclosure, a variable venting assembly configured to mechanically couple to a chassis of an information handling system, the variable venting assembly comprising a wall having a plurality of spaced venting holes and an adjustable venting block mechanically coupled to the wall via an axis of rotation and having a plurality of spaced blocking fins such that as a position of the adjustable venting block varies, an overlap between the spaced blocking fins and the spaced venting holes varies.

In accordance with these and other embodiments of the present disclosure, a method for forming a variable venting assembly configured to mechanically couple to a chassis of an information handling system may include mechanically coupling a wall having a plurality of spaced venting holes to an adjustable venting block mechanically coupled to the wall via an axis of rotation, the adjustable venting block having a plurality of spaced blocking fins such that as a position of the adjustable venting block varies, an overlap between the spaced blocking fins and the spaced venting holes varies.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

Figure 1:
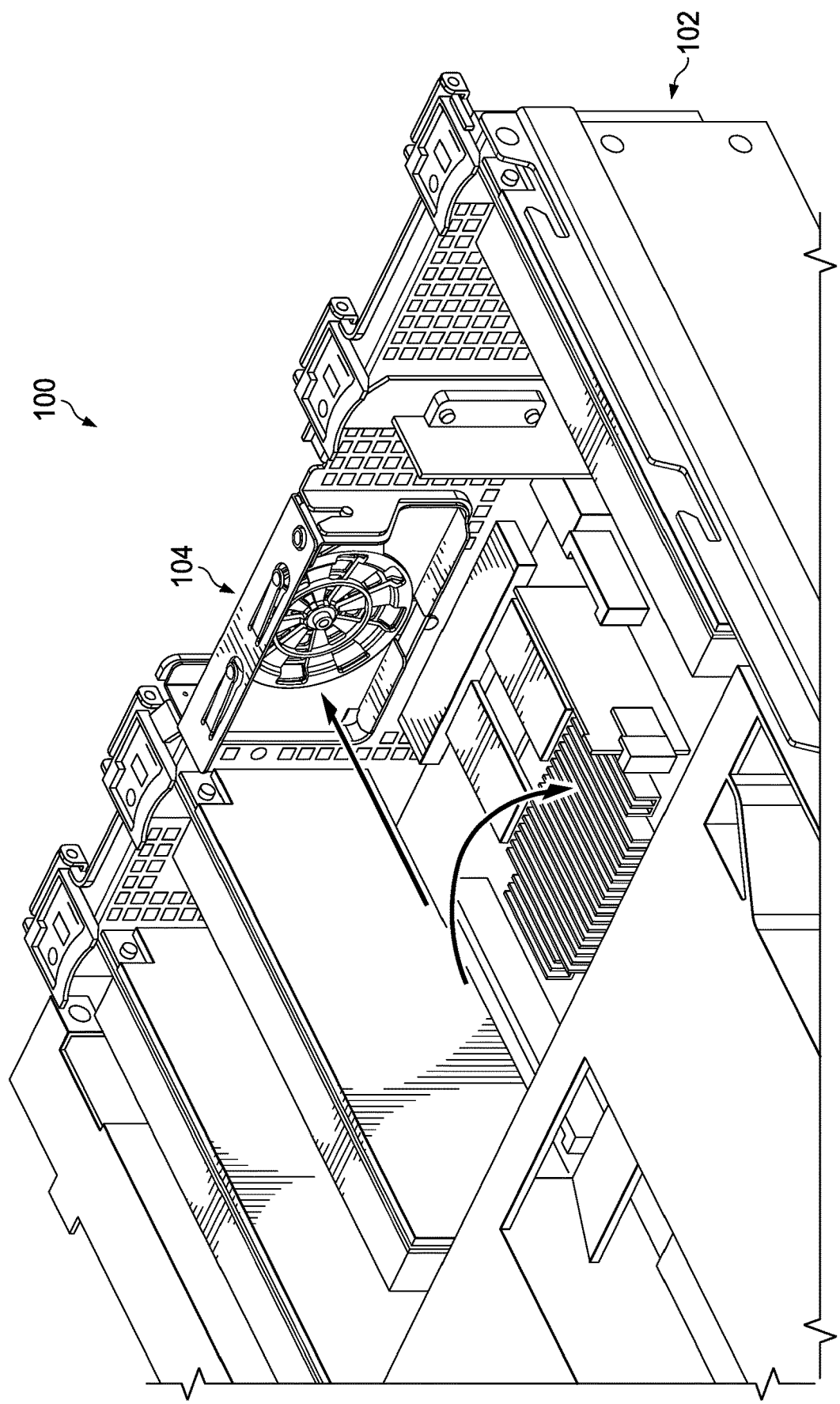
FIG. 1 illustrates an example information handling system having a variable venting assembly, in accordance with the present disclosure.

FIG. 1 illustrates an example information handling system 100 having a variable venting assembly 104, in accordance with the present disclosure. In some embodiments, an information handling system 100 may comprise a server chassis configured to house a plurality of servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house a plurality of physical disk drives and/or other computer-readable media for storing data.

As depicted in FIG. 1, information handling system 100 may include a chassis 102 having a variable venting assembly 104, and one or more other components. Chassis 102 may be an enclosure that serves as a container for various information handling resources of information handling system 100, and may be constructed from steel, aluminum, plastic, and/or any other suitable material. Although the term "chassis" is used, chassis 102 may also be referred to as a case, cabinet, tower, box, enclosure, and/or housing.

Variable venting assembly 104 may be placed on an exterior wall (e.g., a front wall or rear wall) of chassis 102 such that air flow egressing from chassis 102 may egress through variable venting assembly 104. Variable venting assembly 104 is discussed in greater detail below with respect to FIGS. 3A-4B.

Figure 2:
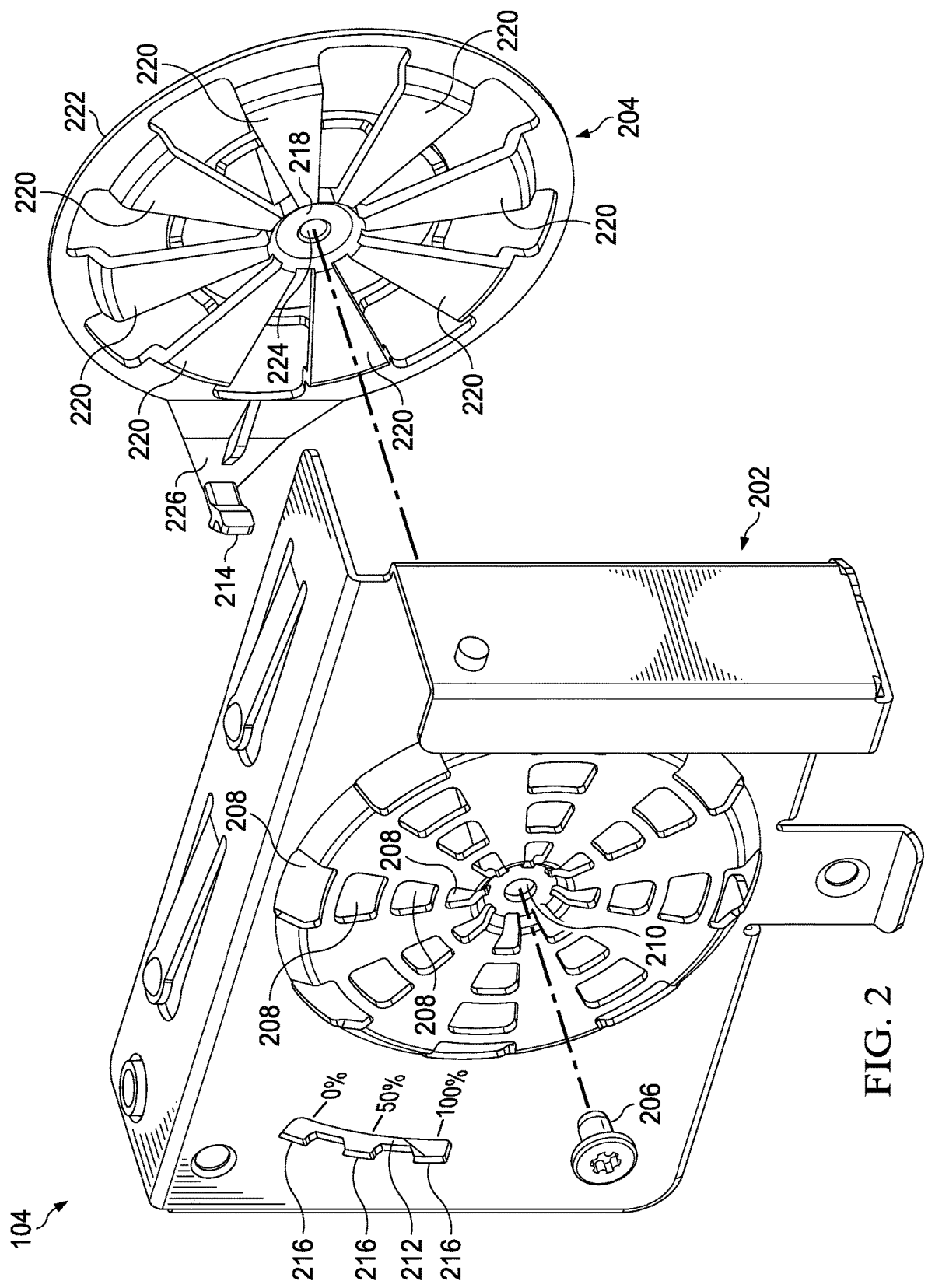
FIG. 2 illustrates a perspective exploded view of an example variable venting assembly, in accordance with the present disclosure.

FIG. 2 illustrates a perspective exploded view of an example variable venting assembly 104, in accordance with the present disclosure. As shown in FIG. 2, variable venting assembly 104 may include a wall 202 and an adjustable venting block 204 mechanically coupled to wall 202 via an axis pin 206.

Wall 202 may be formed out of any suitable material, including metal. As shown in FIG. 2, wall 202 may comprise a plurality of venting holes 208 spaced throughout wall 202 in any suitable manner. Wall 202 may also include an axis hole 210 for receiving axis pin 206. Further, wall 202 may include a venting block opening 212 for receiving a hook 214 of adjustable venting block 204, the venting block opening 212 having a plurality of venting block stops 216 to fix adjustable venting block 204 in a desired position relative to wall 202.

Adjustable venting block 204 may be formed out of any suitable material, including metal or plastic. As shown in FIG. 2, adjustable venting block 204 may be generally circular in nature, and comprise a central hub 218 and an outer ring 222 concentric with central hub 218, with a plurality of spaced blocking fins 220 extending between central hub 218 and outer ring 222. An arm 226 may extend from outer ring 222 and hook 214 may be formed at an end of arm 226. Further, central hub 218 may have formed therein a threaded insert 224 configured to receive axis pin 206.

Accordingly, variable venting assembly 104 may be assembled by aligning axis hole 210 with threaded insert 224, aligning hook 214 with venting block opening 212, and inserting axis pin 206 through axis hole 210 and into threaded insert 224. As assembled, variable venting assembly 104 may be rotatably coupled to wall 202 via a rotational axis passing through axis pin 206, axis hole 210, and threaded insert 224, with the angle of rotation constrained by mechanical interaction of hook 214 within a dimension of venting block opening 212.

Although not explicitly shown in FIG. 2 or described in reference to FIG. 2, wall 202 may have one or more mechanical features configured for mounting variable venting assembly 104 at a desired location within chassis 202.

Figure 3A:
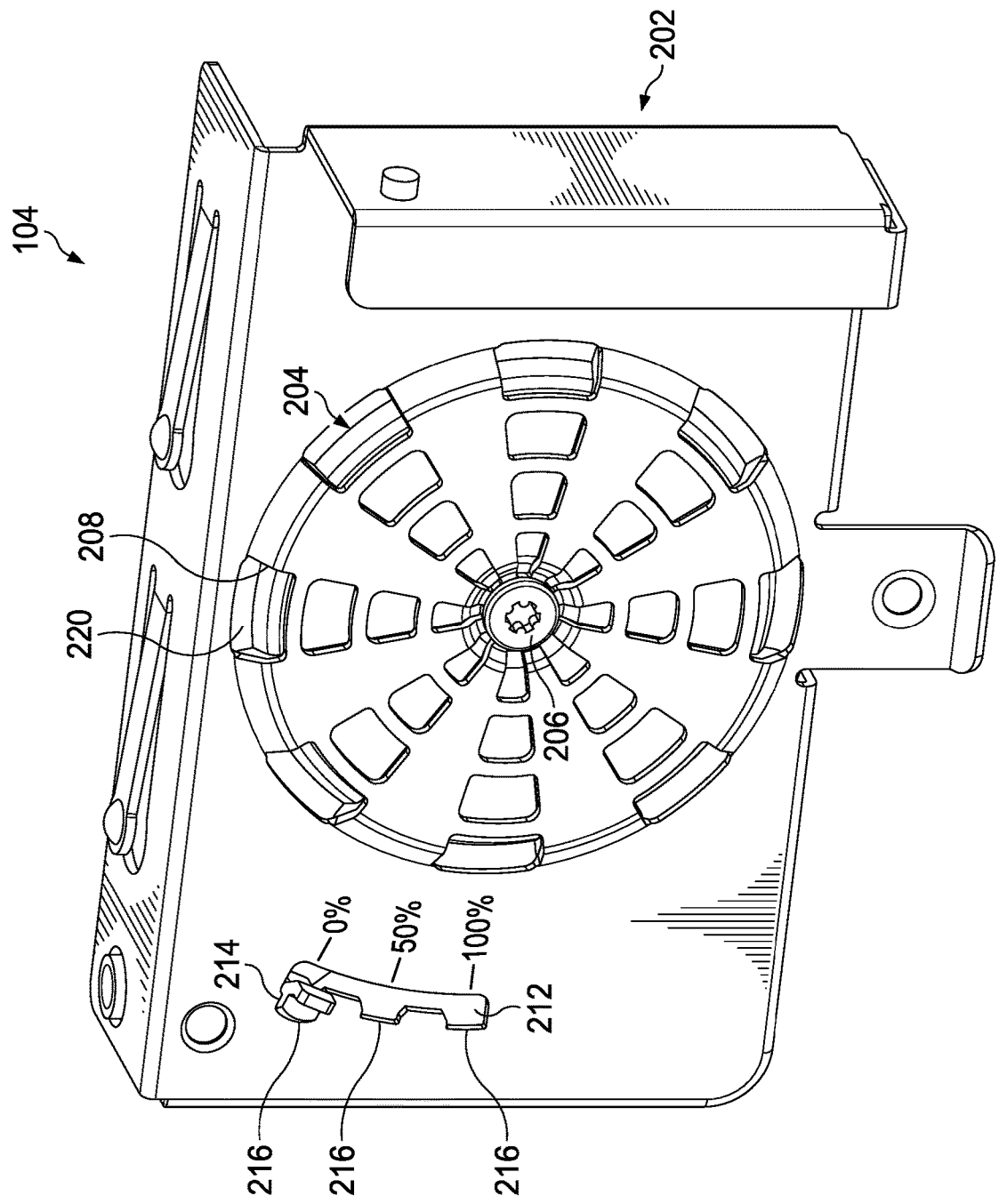
FIGS. 3A-3C illustrate perspective assembled views of the example variable venting assembly of FIG. 2, each having a different venting ratio, in accordance with the present disclosure.
Figure 3B:
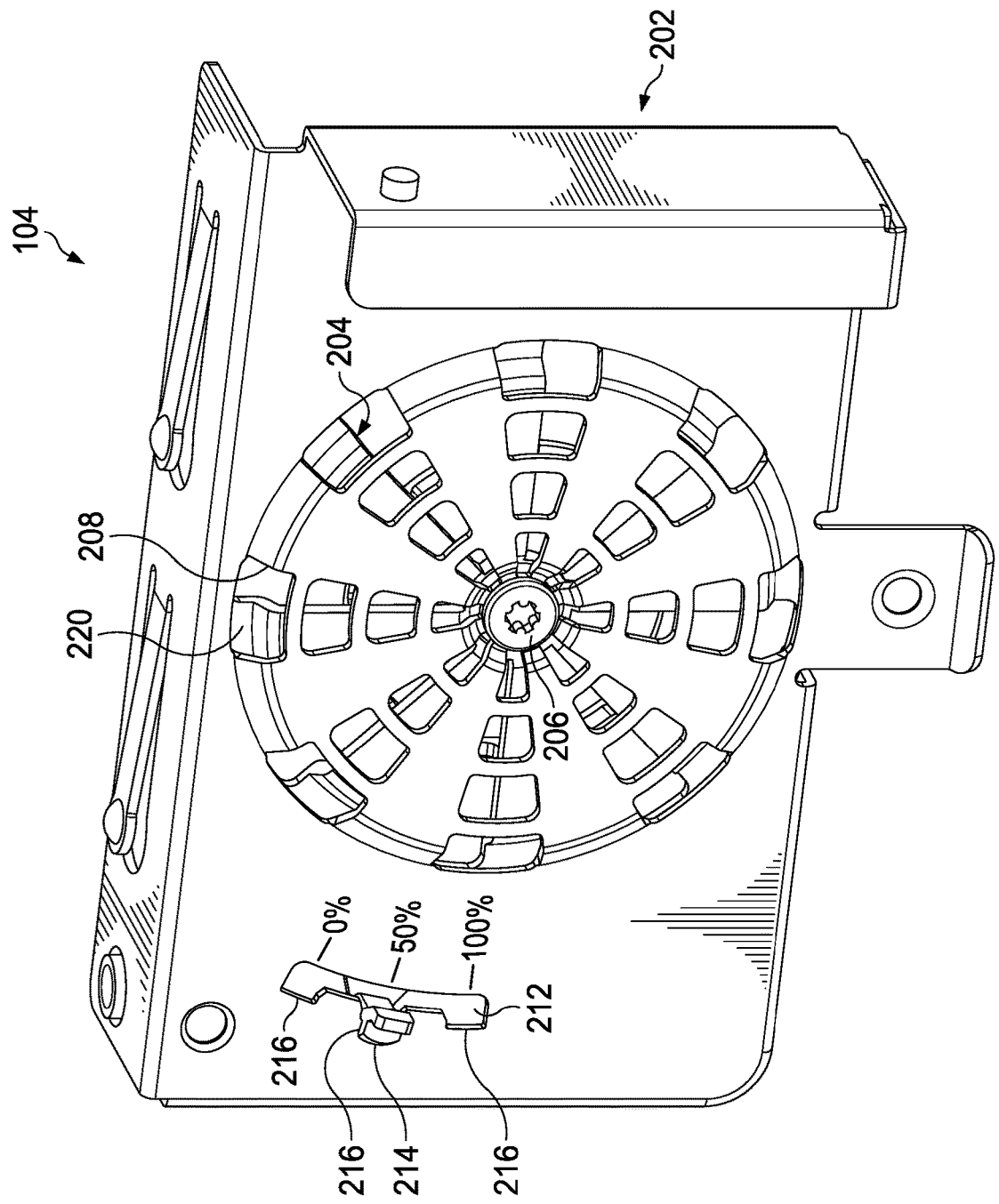
Figure 3C:
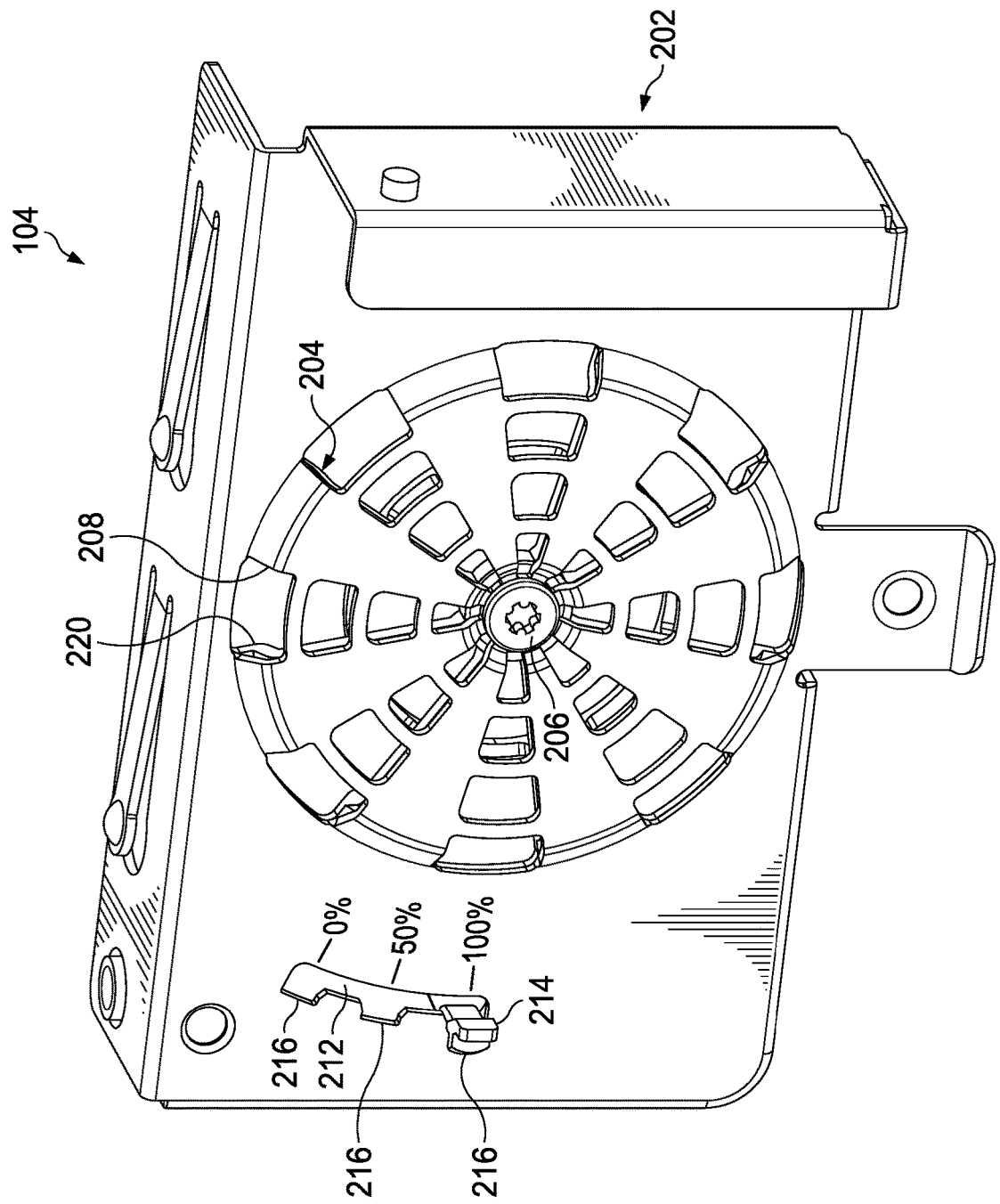

FIGS. 3A-3C illustrate perspective assembled views of example variable venting assembly 104 of FIG. 2, each having a different venting ratio, in accordance with the present disclosure. For example, as shown in FIG. 3A, hook 214 may be mechanically engaged with a first venting block stop 216 of venting block opening 212, which may mechanically retain adjustable venting block 204 in a position relative to wall 202 such that blocking fins 220 fully overlap venting holes 208, to prevent air flow through venting holes 208. Such position may be said to provide a 0% venting ratio, as indicated by an indicator printed or otherwise formed proximate to the first venting block stop 216.

To change a position of adjustable venting block 204 relative to wall 202, a user may apply a force to hook 214, causing hook 214 and arm 226 to deflect relative to the remainder of adjustable venting block 204 and disengage hook 214 from the first venting block stop 216. The user then may apply further force to adjustable venting block 204 (e.g., via hook 214) to engage hook 214 to another venting block stop 216. For example, as shown in FIG. 3B, hook 214 may be mechanically engaged with a second venting block stop 216 of venting block opening 212, which may mechanically retain adjustable venting block 204 in a position relative to wall 202 such that blocking fins 220 partially overlap venting holes 208, to allow some air flow through venting holes 208. Such position may be said to provide a 50% venting ratio, as indicated by an indicator printed or otherwise formed proximate to the second venting block stop 216.

As another example, as shown in FIG. 3C, hook 214 may be mechanically engaged with a third venting block stop 216 of venting block opening 212, which may mechanically retain adjustable venting block 204 in a position relative to wall 202 such that blocking fins 220 do not overlap venting holes 208, to allow air flow to fully pass through venting holes 208. Such position may be said to provide a 100% venting ratio, as indicated by an indicator printed or otherwise formed proximate to the third venting block stop 216.

Although FIGS. 2 and 3A-3C depict venting block opening 212 having three venting block stops 216 corresponding to venting ratios of 0%, 50%, and 100%, it is understood that venting block opening 212 may have any suitable plurality of venting block stops 216 (e.g., two venting block stops 216 corresponding to venting ratios of 0% and 100%; four venting block stops 216 corresponding to venting ratios of 0%, 33%, 67%, and 100%; five venting block stops 216 corresponding to venting ratios of 0%, 25%, 50%, 75%, and 100%; six venting block stops 216 corresponding to venting ratios of 0%, 20%, 40%, 60%, 80%, and 100%; etc.).

Figure 4A:
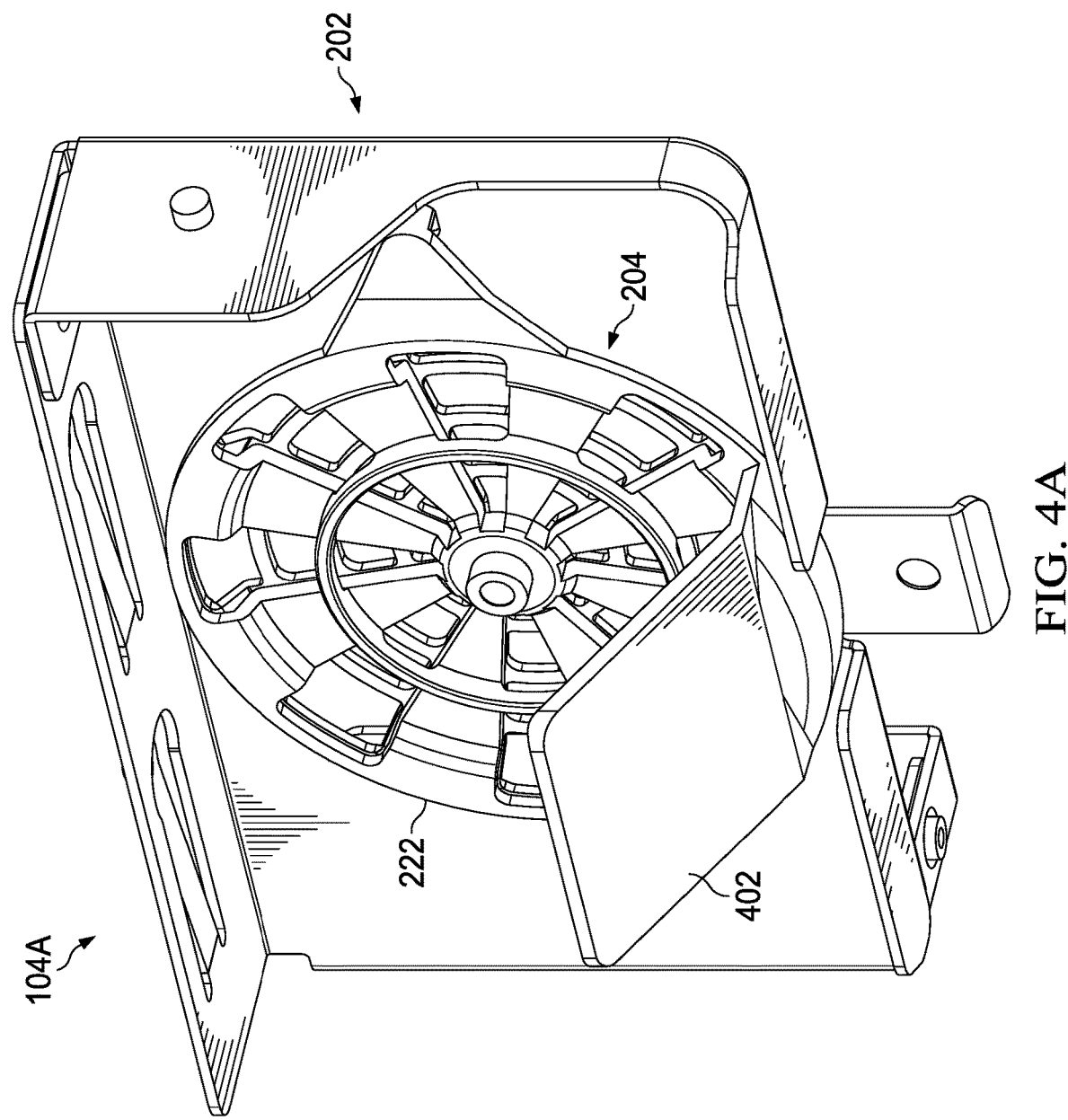
FIGS. 4A-4B illustrate an alternative example variable venting assembly, in accordance with the present disclosure.
Figure 4B:
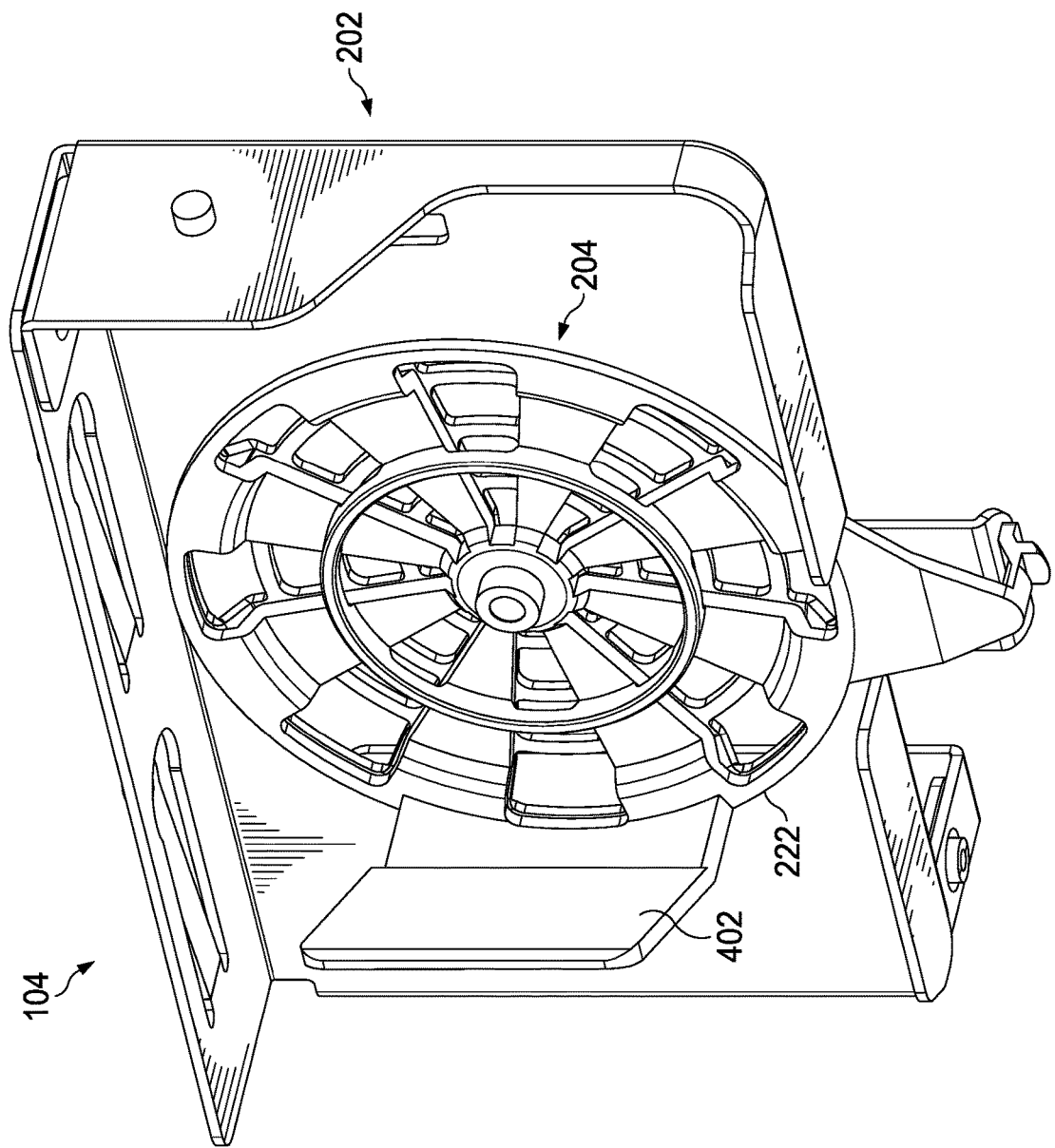

FIGS. 4A and 4B illustrate an alternative example variable venting assembly 104A, in accordance with the present disclosure. As shown in FIGS. 4A and 4B, variable venting assembly 104A may be similar in many material respects to variable venting assembly 104 depicted in FIGS. 2 and 3A-3C. However, one main difference is that variable venting assembly 104A may include a fin 402 extending from outer ring 222 in a direction generally parallel to the direction of the rotational axis of adjustable venting block 204 relative to wall 202. Accordingly, by rotating adjustable venting block 204 to a desired position relative to wall 202, fin 402 may be located in a desired position to direct airflow in a desired direction.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
    a chassis; and
    a variable venting assembly comprising:
        a wall having a plurality of spaced venting holes;
        an adjustable venting block mechanically coupled to the wall along an axis of rotation and having a plurality of spaced blocking fins such that as a position of the adjustable venting block varies, an overlap between the plurality of spaced blocking fins and the plurality of spaced venting holes varies; and
        a hook formed on an arm extending from the adjustable venting block;
        wherein the wall further comprises a venting block opening configured to receive the hook such that rotation of the adjustable venting block relative to the wall is constrained by motion of the hook within a length of the venting block opening.

2. The information handling system of claim 1, the variable venting assembly further comprising an axis pin configured to pass through an axis hole of the wall and mechanically engage with an insert of the adjustable venting block to mechanically couple the adjustable venting block to the wall such that the axis of rotation passes through the axis pin, the axis hole, and the insert.

3. The information handling system of claim 1, wherein the adjustable venting block is generally circular in shape and further comprises:
    a central hub through which the axis of rotation passes; and
    an outer ring concentric with the central hub, with the plurality of spaced blocking fins extending between the central hub and the outer ring.

4. The information handling system of claim 3, wherein: the arm extends from the outer ring.

5. The information handling system of claim 4, wherein the adjustable venting block further comprises a plurality of venting block stops formed within the venting block opening, each of the plurality of venting block stops configured to engage with the hook to fix the adjustable venting block in a respective desired position relative to the wall.

6. The information handling system of claim 3, the adjustable venting block further comprising a fin extending from the outer ring in a direction generally parallel to a direction of the axis of rotation of the adjustable venting block relative to the wall, such that by rotating the adjustable venting block to a desired position relative to the wall, the fin is located to direct airflow in a desired direction.

7. A variable venting assembly configured to mechanically couple to a chassis of an information handling system, the variable venting assembly comprising:
- a wall having a plurality of spaced venting holes;
- an adjustable venting block mechanically coupled to the wall along an axis of rotation and having a plurality of spaced blocking fins such that as a position of the adjustable venting block varies, an overlap between the plurality of spaced blocking fins and the plurality of spaced venting holes varies; and
- a hook formed on an arm extending from the adjustable venting block;
- wherein the wall further comprises a venting block opening configured to receive the hook such that rotation of the adjustable venting block relative to the wall is constrained by motion of the hook within a length of the venting block opening.

8. The variable venting assembly of claim 7, the variable venting assembly further comprising an axis pin configured to pass through an axis hole of the wall and mechanically engage with an insert of the adjustable venting block to mechanically couple the adjustable venting block to the wall such that the axis of rotation passes through the axis pin, the axis hole, and the insert.

9. The variable venting assembly of claim 7, wherein the adjustable venting block is generally circular in shape and further comprises:
- a central hub through which the axis of rotation passes; and
- an outer ring concentric with the central hub, with the plurality of spaced blocking fins extending between the central hub and the outer ring.

10. The variable venting assembly of claim 9, wherein: the arm extends from the outer ring.

11. The variable venting assembly of claim 10, wherein the adjustable venting block further comprises a plurality of venting block stops formed within the venting block opening, each of the plurality of venting block stops configured to engage with the hook to fix the adjustable venting block in a respective desired position relative to the wall.

12. The variable venting assembly of claim 9, the adjustable venting block further comprising a fin extending from the outer ring in a direction generally parallel to a direction of the axis of rotation of the adjustable venting block relative to the wall, such that by rotating the adjustable venting block to a desired position relative to the wall, the fin is located to direct airflow in a desired direction.

13. A method for forming a variable venting assembly configured to mechanically couple to a chassis of an information handling system, the method comprising:
- mechanically coupling a wall having a plurality of spaced venting holes to an adjustable venting block mechanically coupled to the wall along an axis of rotation, the adjustable venting block having a plurality of spaced blocking fins such that as a position of the adjustable venting block varies, an overlap between the plurality of spaced blocking fins and the plurality of spaced venting holes varies; and
- forming a hook on an arm extending from the adjustable venting block;
- wherein the wall further comprises a venting block opening configured to receive the hook such that rotation of the adjustable venting block relative to the wall is constrained by motion of the hook within a length of the venting block opening.

14. The method of claim 13, further comprising passing an axis pin configured to pass through an axis hole of the wall and mechanically engaging the axis pin with an insert of the adjustable venting block to mechanically couple the adjustable venting block to the wall such that the axis of rotation passes through the axis pin, the axis hole, and the insert.

15. The method of claim 13, wherein the adjustable venting block is generally circular in shape and further comprises:
- a central hub through which the axis of rotation passes; and
- an outer ring concentric with the central hub, with the plurality of spaced blocking fins extending between the central hub and the outer ring.

16. The method of claim 15, wherein:
the arm extends from the outer ring.

17. The method of claim 16, wherein the adjustable venting block further comprises a plurality of venting block stops formed within the venting block opening, each of the plurality of venting block stops configured to engage with the hook to fix the adjustable venting block in a respective desired position relative to the wall.

18. The method of claim 15, the adjustable venting block further comprising a fin extending from the outer ring in a direction generally parallel to a direction of the axis of rotation of the adjustable venting block relative to the wall, such that by rotating the adjustable venting block to a desired position relative to the wall, the fin is located to direct airflow in a desired direction.

* * * * *